(12) United States Patent
Lee et al.

(10) Patent No.: US 12,170,343 B2
(45) Date of Patent: Dec. 17, 2024

(54) LIGHT EMITTING ELEMENT AND DISPLAY DEVICE INCLUDING THE SAME

(71) Applicant: Samsung Display Co., Ltd., Yongin-si (KR)

(72) Inventors: Jong Won Lee, Yongin-si (KR); Je Won Yoo, Yongin-si (KR); Chul Jong Yoo, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 304 days.

(21) Appl. No.: 17/307,717

(22) Filed: May 4, 2021

(65) Prior Publication Data

US 2022/0077350 A1    Mar. 10, 2022

(30) Foreign Application Priority Data

Sep. 4, 2020   (KR) ........................ 10-2020-0113185

(51) Int. Cl.
  *H01L 33/38* (2010.01)
  *H01L 27/15* (2006.01)
  *H01L 33/20* (2010.01)

(52) U.S. Cl.
  CPC .......... *H01L 33/382* (2013.01); *H01L 27/156* (2013.01); *H01L 33/20* (2013.01)

(58) Field of Classification Search
  CPC ..... H01L 33/00–648; H01L 27/15–156; H01L 2933/00–0091
  See application file for complete search history.

(56) References Cited

U.S. PATENT DOCUMENTS

| 10,026,777 | B2 * | 7/2018 | Kang | .............. H01L 33/005 |
| 10,910,512 | B2 | 2/2021 | Sung | |
| 10,964,842 | B2 | 3/2021 | Sung | |
| 2016/0149084 | A1 | 5/2016 | Sudhiranjan et al. | |
| 2018/0175104 | A1 * | 6/2018 | Kang | .............. H01L 33/005 |

(Continued)

FOREIGN PATENT DOCUMENTS

| KR | 20120029284 A * | 9/2010 | ............. H01L 33/20 |
| KR | 10-2012-0122160 A | 11/2012 | |

(Continued)

OTHER PUBLICATIONS

DOI: 10.1039/C7TC04300G (Review Article) J. Mater. Chem. C, 2017, 5, 11992-12022 (Year: 2017).*

(Continued)

*Primary Examiner* — Evren Seven
*Assistant Examiner* — Cole Leon Lindsey
(74) *Attorney, Agent, or Firm* — Lewis Roca Rothgerber Christie LLP

(57) ABSTRACT

A light emitting element and a display device including the same are provided. The light emitting element includes: a first semiconductor layer, a second semiconductor layer, and an active layer between the first semiconductor layer and the second semiconductor layer; a passivation layer surrounding an outer surface of at least one selected from the first semiconductor layer, the second semiconductor layer, and the active layer; and an insulation layer surrounding an outer surface of the passivation layer, wherein the passivation layer includes a two-dimensional (2D) material.

18 Claims, 12 Drawing Sheets

(56) References Cited

U.S. PATENT DOCUMENTS

2021/0167050 A1   6/2021   Cho et al.
2021/0226165 A1   7/2021   Ko et al.

FOREIGN PATENT DOCUMENTS

| KR | 10-2016-0059574 A | 5/2016 |
| KR | 10-2016-0059576 A | 5/2016 |
| KR | 10-2020-0021014 A | 2/2020 |
| KR | 10-2021-0095266 A | 8/2021 |

OTHER PUBLICATIONS

Bensong Wan et al 2015 Nanotechnology 26 435702 (Year: 2015).*
Tanjil MR-E, Jeong Y, Yin Z, Panaccione W, Wang MC. Ängström-Scale, Atomically Thin 2D Materials for Corrosion Mitigation and Passivation. Coatings. 2019; 9(2):133. https://doi.org/10.3390/coatings9020133 (Year: 2019).*
Tanjil MR-E, Jeong Y, Yin Z, Panaccione W, Wang MC. Ängström-Scale, Atomically Thin 2D Materials for Corrosion Mitigation and Passivation. Coatings. 2019; 9(2):133. https://doi.org/10.3390/coatings9020133 (Year: 2019) (Year: 2019).*
International Search Report was issued on Nov. 26, 2021 in International Application No. PCT/KR2021/010691, 3pp.
Lei Zhang, et al., "Improving the Quality of GaN Crystals by Using Graphene or Hexagonal Boron Nitride Nanosheets Substrate", ACS Applied Material Interfaces, No. 7, (2015), pp. 4504-4510.

\* cited by examiner

LD: LD1, LD2, LD3

LIGHT EMITTING ELEMENT AND DISPLAY DEVICE INCLUDING THE SAME

CROSS-REFERENCE TO RELATED APPLICATION

This application claims priority to and the benefit of Korean Patent Application No. 10-2020-0113185 filed in the Korean Intellectual Property Office on Sep. 4, 2020, the entire contents of which are incorporated herein by reference.

BACKGROUND

1. Field

Embodiments of the present disclosure relate to a light emitting element and a display device including the same.

2. Description of the Related Art

Recently, as interest in an information display is increasing, research and development for display devices are continuously conducted.

SUMMARY

The present disclosure has been made in an effort to provide a light emitting element having improved element life-span and efficiency by controlling surface defects of a semiconductor core, and a display device including the same.

The features of embodiments of the present disclosure are not limited to the features mentioned above, and other technical features that are not mentioned may be clearly understood to a person of an ordinary skill in the art using the following description.

An embodiment provides a light emitting element, including: a first semiconductor layer, a second semiconductor layer, and an active layer between the first semiconductor layer and the second semiconductor layer; a passivation layer surrounding an outer surface of at least one selected from the first semiconductor layer, the second semiconductor layer, and the active layer; and an insulation layer surrounding an outer surface of the passivation layer, wherein the passivation layer includes a two-dimensional (2D) material.

The 2D material may include at least one selected from $CaF_2$, $Ti_{0.9}O_2$, Mica, $SiO_2$, $WS_2$, $MoS_2$, $Ni(OH)_2$, $Cu(OH)_2$, $Mg(OH)_2$, GaS, Talc, and hexagonal boron nitride (hBN).

A band gap of the 2D material may be 3.5 eV or more.

The passivation layer may be at least partially on an outer surface of the first semiconductor layer, the second semiconductor layer, and/or the active layer, and an outer surface of the first semiconductor layer, the second semiconductor layer, and/or the active layer exposed by the passivation layer may be in contact with the insulation layer.

The passivation layer may be entirely on outer surfaces of the first semiconductor layer, the second semiconductor layer, and/or the active layer.

The passivation layer may be directly on outer surfaces of the first semiconductor layer, the second semiconductor layer, and/or the active layer.

The insulation layer may include an inorganic material.

The inorganic material may include at least one selected from SiOx, SiNx, SiOxNy, AlOx, AlNx, ZrOx, HfOx, and TiOx.

The insulation layer may include the same (e.g., substantially the same) material as the first semiconductor layer, the second semiconductor layer, and/or the active layer.

The insulation layer may be directly on the passivation layer.

Another embodiment provides a display device including: a plurality of pixels, each of the plurality of pixels including a first electrode and a second electrode spaced apart from each other, and light emitting elements between the first electrode and the second electrode; and each of the light emitting elements including a semiconductor core, a passivation layer surrounding an outer surface of the semiconductor core, and an insulation layer surrounding an outer surface of the passivation layer, wherein the passivation layer includes a two-dimensional (2D) material.

The passivation layer may be at least partially on the outer surface of the semiconductor core, and the semiconductor core exposed by the passivation layer may be in contact with the insulation layer.

The passivation layer may be entirely on the outer surface of the semiconductor core.

The 2D material includes at least one of selected from $CaF_2$, $Ti_{0.9}O_2$, Mica, $SiO_2$, $WS_2$, $MoS_2$, $Ni(OH)_2$, $Cu(OH)_2$, $Mg(OH)_2$, GaS, Talc, and hexagonal boron nitride (hBN).

A band gap of the 2D material may be 3.5 eV or more.

The semiconductor core may include a first semiconductor layer, a second semiconductor layer, and an active layer between the first semiconductor layer and the second semiconductor layer.

The passivation layer may be directly on outer surfaces of the first semiconductor layer, the second semiconductor layer, and/or the active layer.

The insulation layer may include an inorganic material.

The insulation layer may include the same (e.g., substantially the same) material as the semiconductor core.

The insulation layer may be directly on the passivation layer.

Features of other embodiments are included in the detailed description and drawings.

According to embodiments of the present disclosure, because surface defects of a semiconductor core may be effectively controlled by forming a passivation layer of a two-dimensional material on the semiconductor core of a light emitting element, it is possible to improve a life-span and efficiency of the light emitting element.

Effects of embodiments of the present disclosure are not limited by what is described above, and various additional effects are included in the scope of the present specification.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
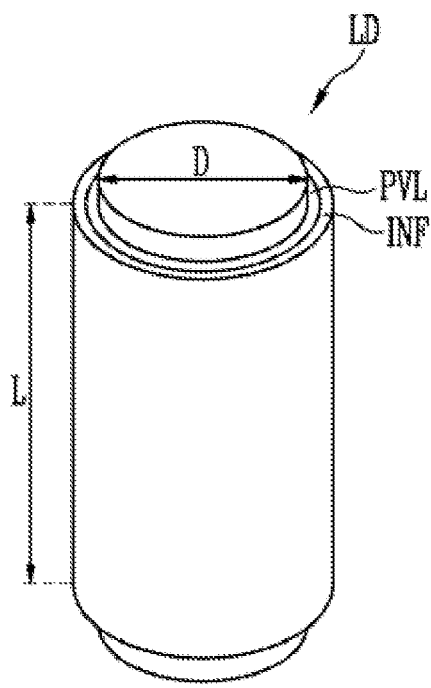
FIG. 1 is a perspective view and FIGS. 2 and 3 are cross-sectional views of a light emitting element according to an embodiment.

Features of embodiments of the present disclosure and methods of accomplishing the same may be understood more readily by reference to the following detailed description of the disclosed embodiments and the accompanying drawings. The subject matter of the present disclosure may, however, be embodied in different forms and should not be construed as limited to the embodiments set forth herein. The present embodiments are provided so that this disclosure will be thorough and complete, and will fully convey the scope of the present disclosure to those skilled in the art. The scope of the present disclosure is only defined by the scope of the appended claims, and equivalents thereof.

The terms used herein are for the purpose of describing particular embodiments only and are not intended to be limiting. As used herein, the singular forms "a", "an" and "the" are intended to include the plural forms as well, unless the context clearly indicates otherwise. It will be further understood that the terms "comprise" and/or "comprising," "include" or "including," and "have" or "having," when used in the present disclosure, specify the presence of stated elements, active acts, operations, and/or devices, but do not preclude the presence or addition of one or more other elements, active acts, operations, and/or devices.

In addition, the term "connection" or "coupling" may comprehensively mean a physical and/or electrical connection or coupling. Further, this may comprehensively mean a direct or indirect connection or coupling, and an integrated or non-integrated connection or coupling.

It will be understood that when an element or a layer is referred to as being "on" another element or layer, it can be directly on another element or layer, or an intervening element or layer may also be present. Throughout the specification, the same reference numerals denote the same constituent elements.

Although the terms "first," "second," and the like are used to describe various constituent elements, these constituent elements are not limited by these terms. These terms are used only to distinguish one constituent element from another constituent element. Therefore, the first constituent elements described below may be considered second constituent elements within the technical spirit of the present disclosure.

Hereinafter, embodiments of the present disclosure will be described in more detail with reference to the accompanying drawings.

Figure 2:
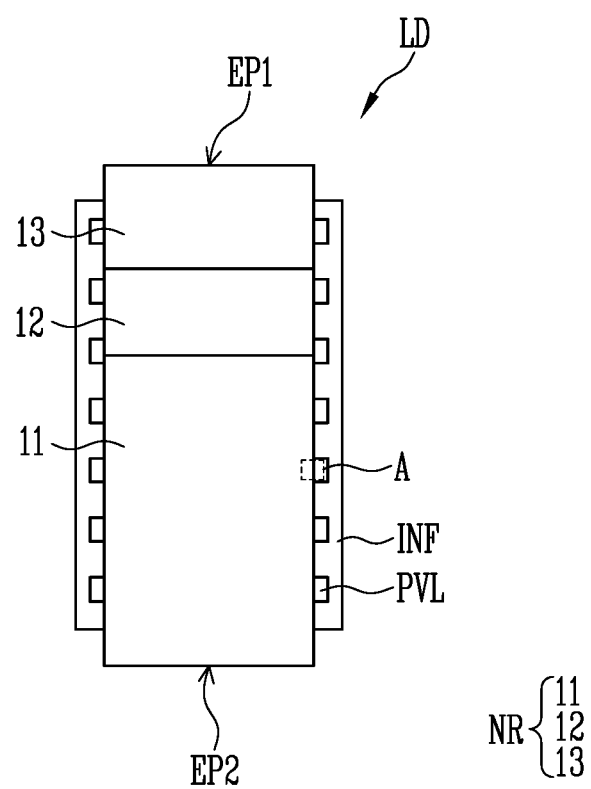
Figure 3:
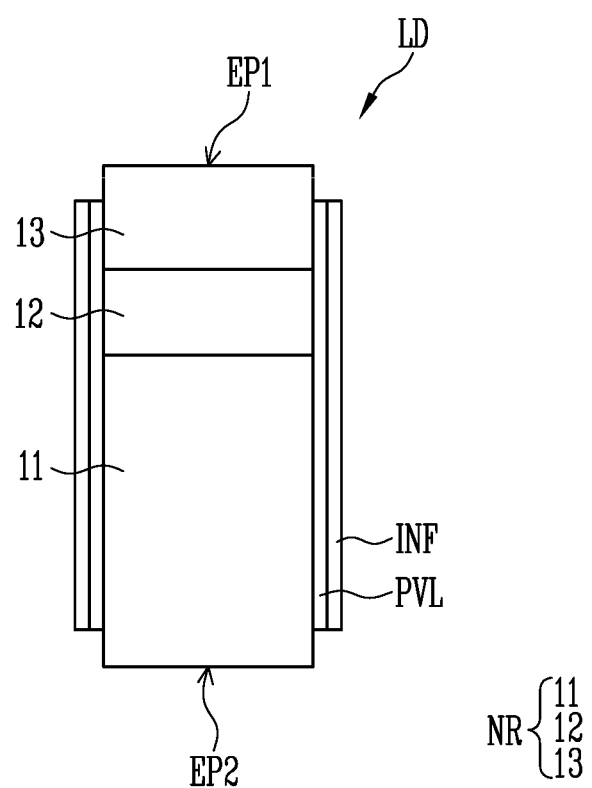

FIG. 1 is a perspective view and FIGS. 2 and 3 are cross-sectional views of a light emitting element according to an embodiment. FIG. 1 to FIG. 3 illustrate a cylindrical shaped light emitting element LD, but a type, kind, and/or shape of the light emitting element LD is not limited thereto.

Referring to FIG. 1 to FIG. 3, the light emitting element LD may include a semiconductor core NR, a passivation layer PVL surrounding the semiconductor core NR, and an insulation layer INF surrounding the passivation layer PVL.

The semiconductor core NR may include a first semiconductor layer 11, a second semiconductor layer 13, and an active layer 12 between the first and second semiconductor layers 11 and 13. For example, when an extending direction of the light emitting element LD is referred to as a length L direction, the semiconductor core NR may include the first semiconductor layer 11, the active layer 12, and the second semiconductor layer 13 sequentially stacked along the length L direction.

In some embodiments, the light emitting element LD may be provided to have a cylindrical shape extending along one direction. The light emitting element LD may have a first end portion EP1 and a second end portion EP2. One selected from the first and second semiconductor layers 11 and 13 may be on the first end portion EP1 of the light emitting element LD. The remaining one of the first and second semiconductor layers 11 and 13 may be on the second end portion EP2 of the light emitting element LD.

In some embodiments, the light emitting element LD may be a light emitting element manufactured in a cylindrical shape through an etching method and/or the like. In the present specification, the term "cylindrical shape" includes a rod-like shape or bar-like shape (e.g., with an aspect ratio greater than 1) that is long in the length L direction, such as a circular cylinder or a polygonal cylinder, but a shape of a cross-section thereof is not particularly limited. For example, the length L of the light emitting element LD may be larger than a diameter D thereof (or a width of a lateral cross-section thereof).

The light emitting element LD may have a size as small as a nanometer scale to a micrometer scale. For example, the light emitting element LD may each have the diameter D (or width) and/or the length L in a range from a nanometer scale to a micrometer scale. However, the size of the light emitting element LD is not limited thereto, and the size of the light emitting element LD may be variously changed according to design conditions of various suitable devices using a light emitting device using the light emitting element LD as a light source, for example, a display device.

The first semiconductor layer 11 may be a first conductive semiconductor layer. For example, the first semiconductor layer 11 may include an N-type semiconductor layer. For example, the first semiconductor layer 11 may include a semiconductor material of one selected from InAlGaN, GaN, AlGaN, InGaN, AlN, and InN, and may include a N-type semiconductor layer doped with a first conductive dopant such as Si, Ge, Sn, and/or the like. However, the material included in the first semiconductor layer 11 is not limited thereto, and the first semiconductor layer 11 may include various suitable materials.

The active layer 12 is on the first semiconductor layer 11, and may be formed to have a single-quantum or multi-quantum well structure. A position of the active layer 12 may be variously changed according to a type or kind of the light emitting element LD.

A clad layer doped with a conductive dopant may be formed at an upper portion and/or a lower portion of the active layer 12. For example, the clad layer may be formed as an AlGaN layer or an InAlGaN layer. In some embodiments, a material such as AlGaN and InAlGaN may be used to form the active layer 12, and in addition, various suitable materials may form the active layer 12.

The second semiconductor layer 13 is on the active layer 12, and may include a semiconductor layer of a type or kind different from that of the first semiconductor layer 11. For example, the second semiconductor layer 13 may include a P-type semiconductor layer. For example, the second semiconductor layer 13 may include at least one semiconductor material selected from InAlGaN, GaN, AlGaN, InGaN, AlN, and InN, and may include a P-type semiconductor layer doped with a second conductive dopant such as Mg. However, the material included in the second semiconductor layer 13 is not limited thereto, and the second semiconductor layer 13 may be formed of various suitable materials.

When a voltage of a threshold voltage or more is applied to respective ends of the light emitting element LD, the light emitting device LD emits light while electron-hole pairs are combined in the active layer 12. By controlling the light emission of the light emitting element LD by using this principle, the light emitting element LD may be used as a light source for various suitable light emitting devices in addition to pixels of a display device.

In some embodiments, the light emitting element LD may further include the passivation layer PVL provided on a surface of the semiconductor core NR. The passivation layer PVL may be directly on surfaces of the first semiconductor layer 11, the active layer 12, and the second semiconductor layer 13.

The passivation layer PVL may surround an external peripheral (e.g., circumferential) surface of the semiconductor core NR, for example, of at least one of the first semiconductor layer 11, the active layer 12, and the second semiconductor layer 13. In the embodiment, the passivation layer PVL may be partially on an outer surface of the semiconductor core NR, for example, the first semiconductor layer 11, the active layer 12, or the second semiconductor layer 13 as shown in FIG. 2. When the passivation layer PVL is partially on the outer surface of the semiconductor core NR, the outer surface of the first semiconductor layer 11, the active layer 12, and/or the second semiconductor layer 13 exposed by the passivation layer PVL may contact (e.g., physically contact) the insulation layer INF to be further described herein below. In this case, the passivation layer PVL may be first formed in a region in which a concentration of surface defects of the semiconductor core NR is high to effectively control the surface defects, which will be further described herein below with reference to FIG. 4.

In another embodiment, the passivation layer PVL may be entirely on an outer surface of the semiconductor core NR, for example, outer surfaces of the first semiconductor layer 11, the active layer 12, and the second semiconductor layer 13 as shown in FIG. 3.

In some embodiments, the passivation layer PVL may expose respective end portions of the semiconductor core NR having different polarities. For example, the passivation layer PVL may expose one end of each of the first and second semiconductor layers 11 and 13 at the first and second end portions EP1 and EP2 of the semiconductor core NR. In another embodiment, the passivation layer PVL may expose side portions of the first and second semiconductor layers 11 and 13 adjacent to the first and second end portions EP1 and EP2 of the semiconductor core NR.

In the embodiment, the passivation layer PVL may include a two-dimensional (2D) material. As used herein, the term "two-dimensional material" may refer to a nanometer-scale crystalline material, for example, a material having a crystalline structure in a plane having a thickness of one to three atoms. For example, the 2D material may have a planar crystal structure having a thickness of 1 nm or less. In this case, the 2D material may form a planar crystal structure by way of sp2 hybrid bonding (e.g., the 2D material may include atoms bonded together by way of bonds formed from sp2 hybridized atomic orbitals, which results in a planar structure). However, the 2D material is not necessarily limited thereto, and the 2D material is a multilayer composed of a plurality of layers made of a nanometer-scale crystalline material, and may be referred to as a material having a structure in which the plurality of layers are combined by van der Waals bonds (e.g., van der Waals forces). In this case, the plurality of layers including the 2D material may be formed by van der Waals bonds (e.g., van der Waals forces), so that respective layers may be relatively easily separated.

When the passivation layer PVL includes the above-described 2D material, because surface defects of the semiconductor core NR may be controlled, a life-span and efficiency of the light emitting element LD may be improved, which will be described in more detail herein below with reference to FIG. 4.

Figure 4:
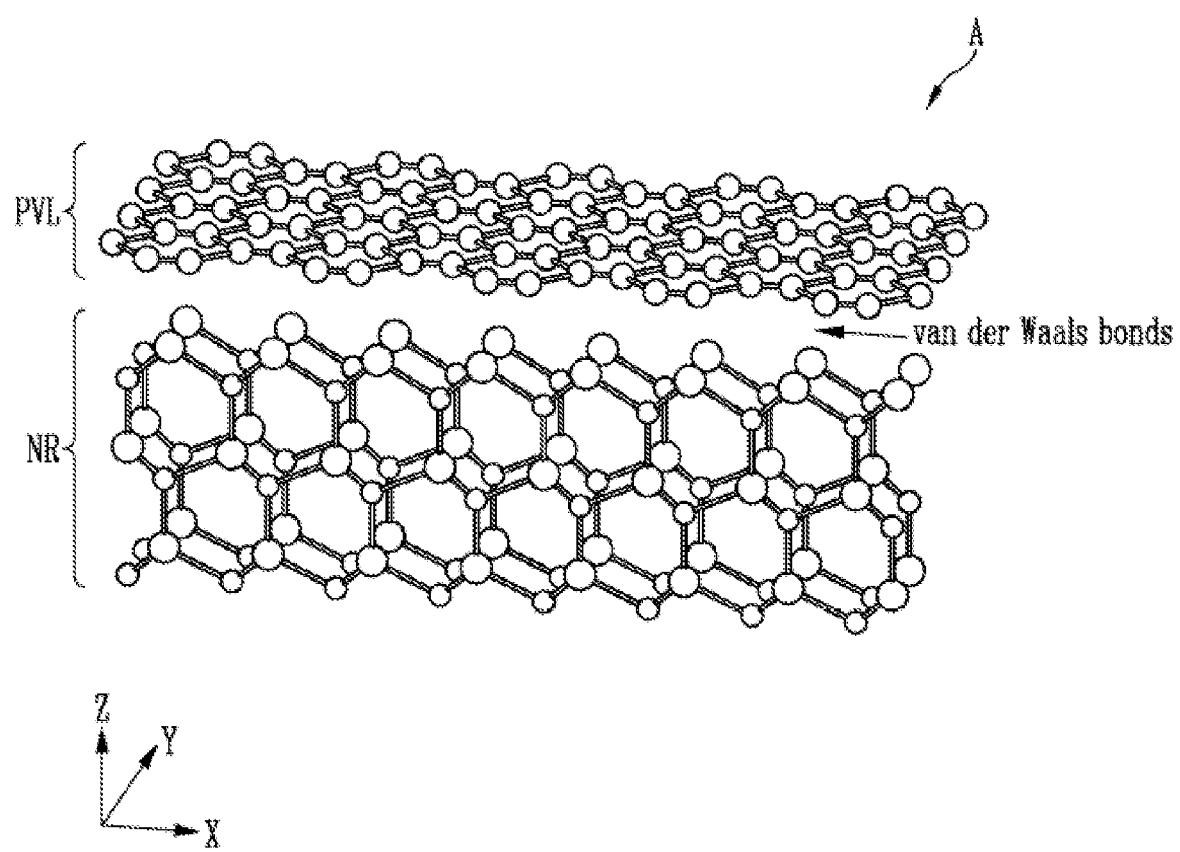
FIG. 4 is an enlarged view of an area "A" of FIG. 2.

FIG. 4 illustrates an enlarged view of area "A" of FIG. 2.

Referring to FIG. 4, the passivation layer PVL may be formed in a two-dimensional thin film structure to form an out-of-plane van der Waals bond (e.g., an out-of-plane van der Waals force) with the surface of the semiconductor core NR. In this case, even if defect portions such as vacancy exist on the surface of the semiconductor core NR, a surface defect concentration may be reduced or the defect portions may be protected by the passivation layer PVL, and thus, surface defects of the semiconductor core NR may be minimized or reduced.

Generally, when a dry etch process is performed to manufacture the semiconductor core NR, a vacancy or dangling bond may be generated because atoms of the surface of the semiconductor core NR are partially lacking (e.g., because certain atoms of the surface of the semiconductor core NR may be missing or may have been removed). Even if a dry etch process is performed to control such surface defects, a defective portion of the semiconductor core NR may not be eliminated. In addition, even if an insulation layer is directly formed on the semiconductor core NR, lattice defects may exist at an interface with the insulation layer INF due to the vacancy of the semiconductor core NR, and thus, the insulation layer is not grown, so that the surface of the semiconductor core NR may not be sufficiently protected. For example, the life-span, efficiency, and crystallinity of the light emitting element LD may be deteriorated due to the surface defect of the semiconductor core NR.

Accordingly, the light emitting element LD according to the embodiment may effectively control the surface defects by first forming the passivation layer PVL in a region in which the surface defect concentration of the semiconductor core NR is high by using the two-dimensional material. In addition, when the passivation layer PVL contains the two-dimensional material, because sp2 hybrid bonding is formed in an in-plane direction, the concentration of surface defects at an interface between the passivation layer PVL and the adjacent insulation layer INF may be minimized or reduced. Therefore, it is possible to improve the life-span and efficiency of the light emitting element LD.

In the embodiment, the passivation layer PVL may include at least one selected from $CaF_2$, $Ti_{0.9}O_2$, Mica, $SiO_2$, $WS_2$, $MoS_2$, $Ni(OH)_2$, $Cu(OH)_2$, $Mg(OH)_2$, GaS, Talc, and hexagonal boron nitride (hBN) as the two-dimensional material, but is not limited thereto. For example, the material of the passivation layer PVL may be selected from various suitable two-dimensional materials having a band gap of 3.5 eV or more.

Referring back to FIG. 3, the light emitting element LD may further include the insulation layer INF provided on the surface of the passivation layer PVL. The insulation layer INF may surround the external peripheral (e.g., circumferential) surface of the passivation layer PVL. The insulation layer INF may be directly formed on the surface of the passivation layer PVL. A thickness of the insulation layer INF may be thicker than that of the passivation layer PVL, but the present disclosure is not limited thereto.

In some embodiments, the insulation layer INF may expose respective end portions of the semiconductor core NR having different polarities. For example, the insulation layer INF may expose one end of each of the first and second semiconductor layers 11 and 13 at the first and second end portions EP1 and EP2 of the semiconductor core NR. In another embodiment, the insulation layer INF may expose side portions of the first and second semiconductor layers 11 and 13 adjacent to the first and second end portions EP1 and EP2 of the semiconductor core NR.

The insulation layer INF may include an inorganic insulating material. In addition, the insulation layer INF may be formed as a single layer or a multilayer including a double layer. When the insulation layer INF is formed as a double layer, respective layers thereof may be formed by using different materials through separate processes. However, the present disclosure is not necessarily limited thereto, and respective layers forming the insulation layer INF may be formed by a continuous process using the same (e.g., substantially the same) material. For example, the insulation layer INF may include at least one insulating material of a silicon oxide (SiOx), a silicon nitride (SiNx), a silicon oxynitride (SiOxNy), an aluminum oxide (AlOx), an aluminum nitride (AlNx), a zirconium oxide (ZrOx), a hafnium oxide (HfOx), and a titanium oxide (TiOx). For example, the insulation layer INF may be formed as a double layer including an aluminum oxide (AlOx) and a silicon oxide (SiOx), but the present disclosure is not limited thereto.

In some embodiments, the insulation layer INF may include the same (e.g., substantially the same) material as the semiconductor core NR, for example, the first semiconductor layer 11, the active layer 12, and/or the second semiconductor layer 13. For example, the insulation layer INF may include at least one selected from InAlGaN, GaN, AlGaN, InGaN, AlN, and InN, but is not limited thereto. As such, when the insulation layer INF includes the same (e.g., substantially the same) material as the semiconductor core NR, epitaxial growth may be possible, and thus a high-quality insulation layer INF may be formed to more effectively control surface defects.

When the insulation layer INF is provided on the semiconductor core NR and the passivation layer PVL, short circuit of the active layer 12 may be prevented (or a likelihood and/or degree of such a short circuit may be reduced) by way of an electrode (for example, at least one of contact electrodes coupled to respective ends of the semiconductor core NR) to be described herein below. Accordingly, electrical stability of the light emitting element LD may be secured or improved. In addition, when the insulation layer INF is provided on the surface of the light emitting element LD, it is possible to improve the life-span and efficiency thereof by minimizing or reducing the surface defects of the light emitting element LD. In addition, it is possible to prevent an unwanted short circuit between the light emitting elements LD from occurring (or to reduce a likelihood or degree of such a short circuit) even when a plurality of light emitting elements LD are in close contact (e.g., physical contact) with each other.

In some embodiments, the light emitting element LD may further include an additional constituent element in addition to the first semiconductor layer 11, the active layer 12, the second semiconductor layer 13, the passivation layer PVL, and/or the insulation layer INF. For example, the light emitting element LD may additionally include one or more of a phosphor layer, an active layer, a semiconductor layer, and/or an electrode layer on one end side of the first semiconductor layer 11, the active layer 12, and/or the second semiconductor layer 13.

Figure 5:
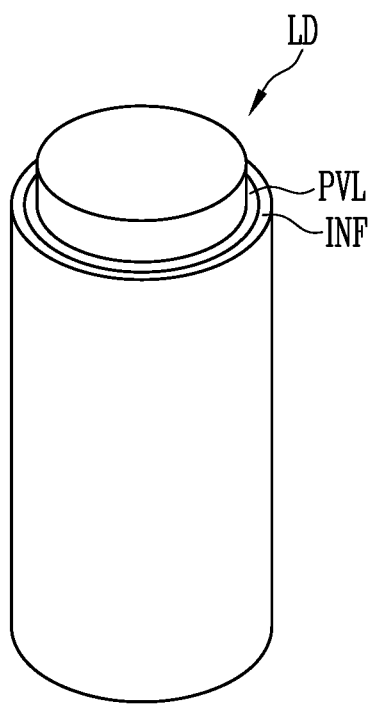
FIG. 5 and FIG. 6 are a perspective view and a cross-sectional view, respectively, of a light emitting element according to another embodiment.
Figure 6:
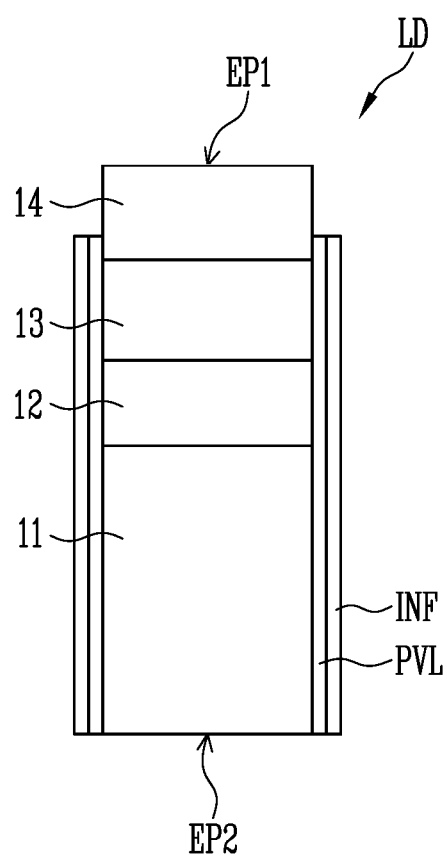

FIG. 5 and FIG. 6 illustrate a perspective view and a cross-sectional view of a light emitting element according to another embodiment.

Referring to FIG. 5 and FIG. 6, the light emitting element LD may further include at least one electrode layer 14 at one end of the second semiconductor layer 13.

The electrode layer 14 may include a metal and/or conductive metal oxide, and for example, it may be formed by singly using or mixing chromium (Cr), titanium (Ti), aluminum (Al), gold (Au), nickel (Ni), an oxide and/or alloy thereof, a transparent electrode material such as an indium tin oxide (ITO), an indium zinc oxide (IZO), a zinc oxide (ZnO), and/or an indium tin zinc oxide (ITZO). The electrode layer 14 may be substantially transparent or translucent. Accordingly, light generated by the light emitting element LD may pass through the electrode layer 14 to be emitted to the outside of the light emitting element LD.

In some embodiments, the passivation layer PVL and/or the insulation layer INF may at least partially cover an external peripheral (e.g., circumferential) surface of the electrode layer 14. For example, the passivation layer PVL and/or the insulation layer INF may be selectively formed on a surface of the electrode layer 14. In addition, the passivation layer PVL and/or insulation layer INF may be formed to expose respective ends of the light emitting element (LD) having different polarities, and for example, they may expose at least one region of the electrode layer 14. However, the present disclosure is not limited thereto.

FIG. 5 and FIG. 6 illustrate only the electrode layer 14 on the second semiconductor layer 13, but the present disclosure is not limited thereto, and the light emitting element LD may further include an electrode layer on the first semiconductor layer 13.

A light emitting device including the light emitting element LD described above may be used in various suitable types or kinds of devices that require a light source in addition to a display device. For example, a plurality of light emitting elements LD may be in each pixel of a display panel, and the light emitting elements LD may be used as a light source of each pixel. However, an application field of the light emitting element LD is not limited to the above-described example. For example, the light emitting element LD may be used in other types or kinds of devices that require a light source, such as a lighting device. Hereinafter, a display device including the light emitting element LD according to the embodiment described above will be described in more detail herein below with reference to FIG. 7 to FIG. 12.

Figure 7:
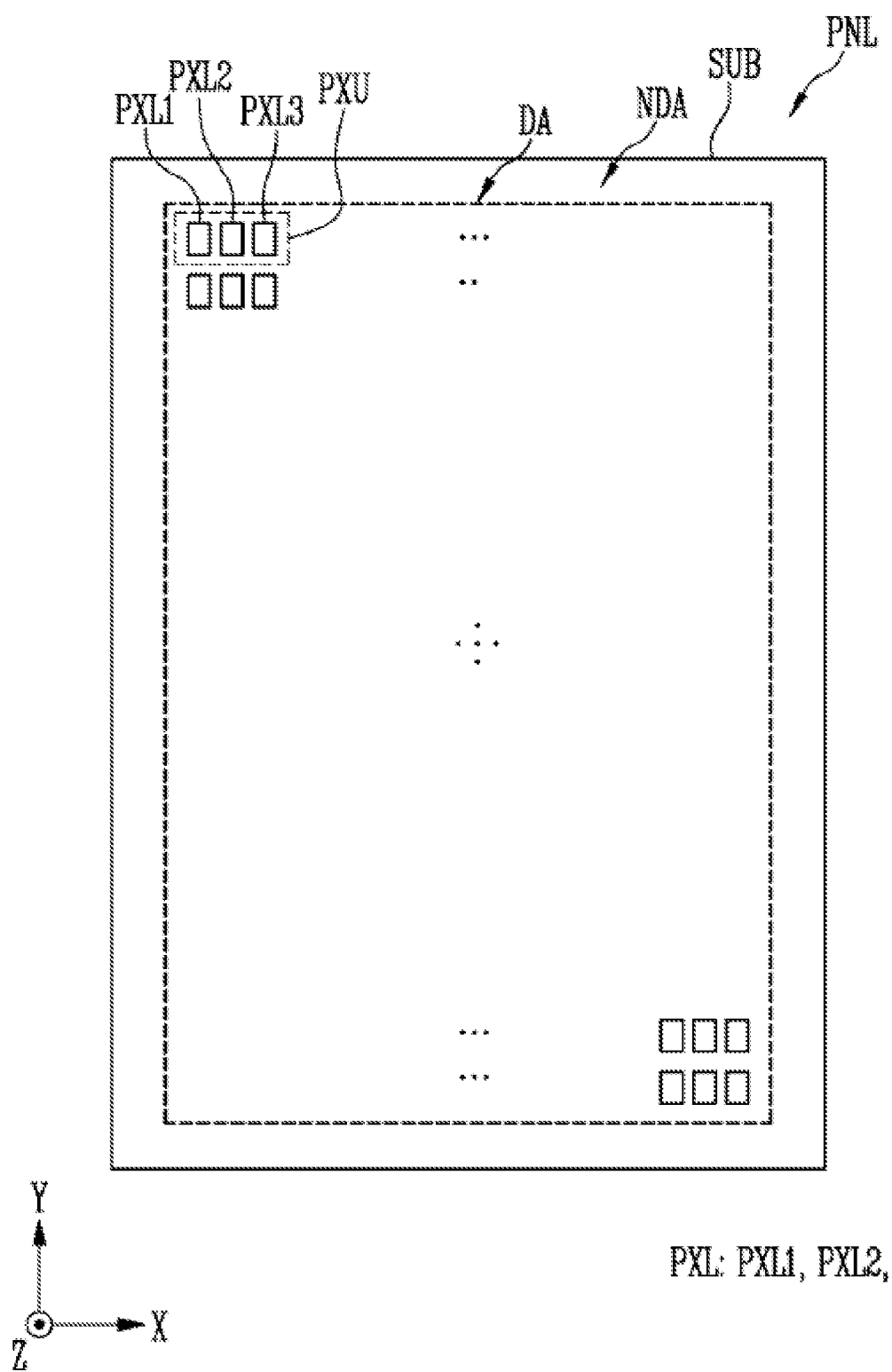
FIG. 7 is a top plan view of a display device according to an embodiment.

FIG. 7 illustrates a top plan view of a display device according to an embodiment.

FIG. 7 illustrates a display device, for example, a display panel PNL provided in the display device as an example of an electronic device that may use the light emitting element LD described in the embodiments of FIG. 1 to FIG. 6 as a light source.

Each pixel unit PXU of the display panel PNL and each pixel included in the same may include at least one light emitting element LD. For convenience, FIG. 7 illustrates a structure of the display panel PNL based on a display area DA. However, in some embodiments, at least one driving circuit portion (for example, at least one of a scan driver and a data driver), wires, and/or pads may be further in the display panel PNL.

Referring to FIG. 7, the display panel PNL may include a substrate SUB and the pixel unit PXU on the substrate SUB. The pixel unit PXU may include first pixels PXL1, second pixels PXL2, and/or third pixels PXL3. Hereinafter, when arbitrarily referring to one or more pixels among the first pixels PXL1, the second pixels PXL2, and the third pixels PXL3, or when comprehensively referring to two or more types or kinds of pixels, they will be referred to as a "pixel PXL" or "pixels PXL".

The substrate SUB configures a base member of the display panel PNL, and may be a rigid and/or flexible substrate and/or film. For example, the substrate SUB may be a hard substrate including glass and/or tempered glass, a flexible substrate (or a thin film) including a plastic and/or metallic material, and/or at least one layered insulation layer. The material and/or physical properties of the substrate SUB are not particularly limited.

In the embodiment, the substrate SUB may be substantially transparent. Here, "substantially transparent" may mean that light may be transmitted at a set or predetermined transmittance or more. In another embodiment, the substrate SUB may be translucent or opaque. In addition, the substrate SUB may include a reflective material according to an embodiment.

The display panel PNL and the substrate SUB for forming the display panel include a display area DA for displaying an image and a non-display area NDA excluding the display area DA.

The pixels PXL may be in the display area DA. In the non-display area NDA, various suitable wires coupled to the pixels PXL of the display area DA, pads, and/or internal circuit parts may be located. The pixels PXL may be regularly arranged according to a stripe or PENTILE® arrangement structure (PENTILE® is a registered trademark of Samsung Display Co., Ltd.). For example, the pixels PXL may be regularly arranged in a diamond shape arrangement (e.g., an RGBG matrix, RGBG structure, RGBG matrix structure). However, the arrangement structure of the pixels PXL is not limited thereto, and the pixels PXL may be arranged in the display area DA in various suitable structures and/or methods.

In some embodiments, two or more types or kinds of pixels PXL emitting light of different colors may be in the display area DA. For example, in the display area DA, the first pixels PXL1 emitting light of the first color, the second pixels PXL2 emitting light of the second color, and the third pixels PXL3 emitting light of the third color may be arranged. At least one first to third pixels PXL1, PXL2, and PXL3 adjacent to each other may form one pixel unit PXU that may emit light of various suitable colors. For example, each of the first to third pixels PXL1, PXL2, and PXL3 may be sub-pixel emitting light of a set or predetermined color. In some embodiments, the first pixel PXL1 may be a red pixel that emits red light, the second pixel PXL2 may be a green pixel that emits green light, and the third pixel PXL3 may be a blue pixel that emits blue light, but the present disclosure is not limited thereto.

In the embodiment, the first pixel PXL1, the second pixel PXL2, and the third pixel PXL3 are each provided with a first color light emitting element, a second color light emitting element, and a third color light emitting element as a light source, respectively, so that they respectively emit light of the first color, the second color, and the third color. In another embodiment, the first pixel PXL1, the second pixel PXL2, and the third pixel PXL3 are provided with light emitting elements of the same (e.g., substantially the same) color, and include color conversion layers and/or color filters of different colors on respective light emitting elements, so that they may emit light of the first color, the second color, and the third color, respectively. However, the color, type, kind, and/or number of pixels PXL to configure each pixel unit PXU are not particularly limited. For example, the color of light emitted by each pixel PXL may be variously changed.

The pixel PXL may include at least one light source driven by a set or predetermined control signal (for example, a scan signal and a data signal) and/or a set or predetermined power source (for example, a first power source and a second power source). In the embodiment, the light source may include at least one light emitting device LD according to one of the embodiments of FIG. 1 to FIG. 6, for example, ultra-small cylindrical shape light emitting elements LD having a size as small as nanometer scale to micrometer scale. However, the present disclosure is not limited thereto, and various suitable types or kinds of light emitting elements LD may be used as a light source of the pixel PXL.

In the embodiment, each pixel PXL may be configured as an active pixel. However, the type, kind, structure, and/or driving method of pixels PXL that may be applied to or used in the display device are not particularly limited. For example, each pixel PXL may be configured as a pixel of a passive or active light emitting display device of various suitable structures and/or driving methods.

Figure 8:
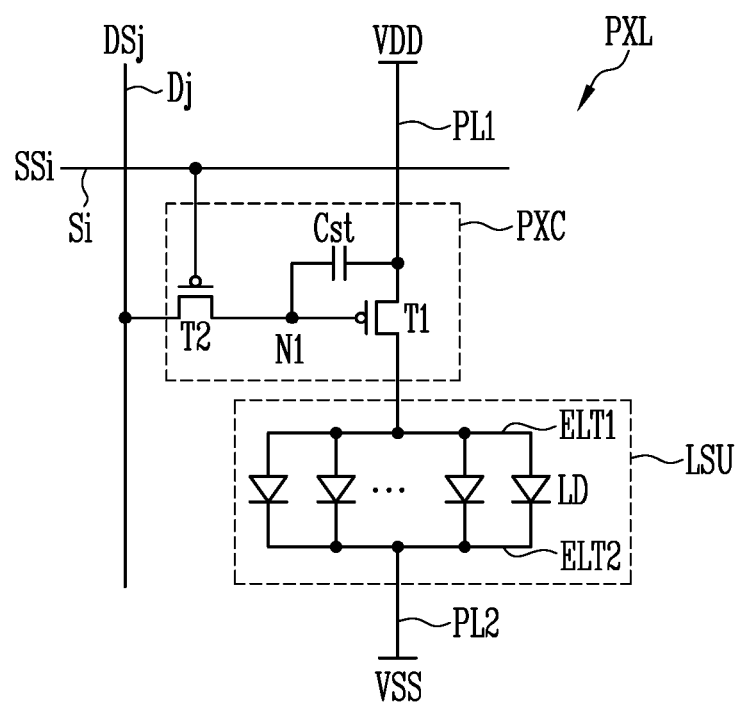
FIG. 8 to FIG. 10 are circuit diagrams of a pixel according to an embodiment.
Figure 9:
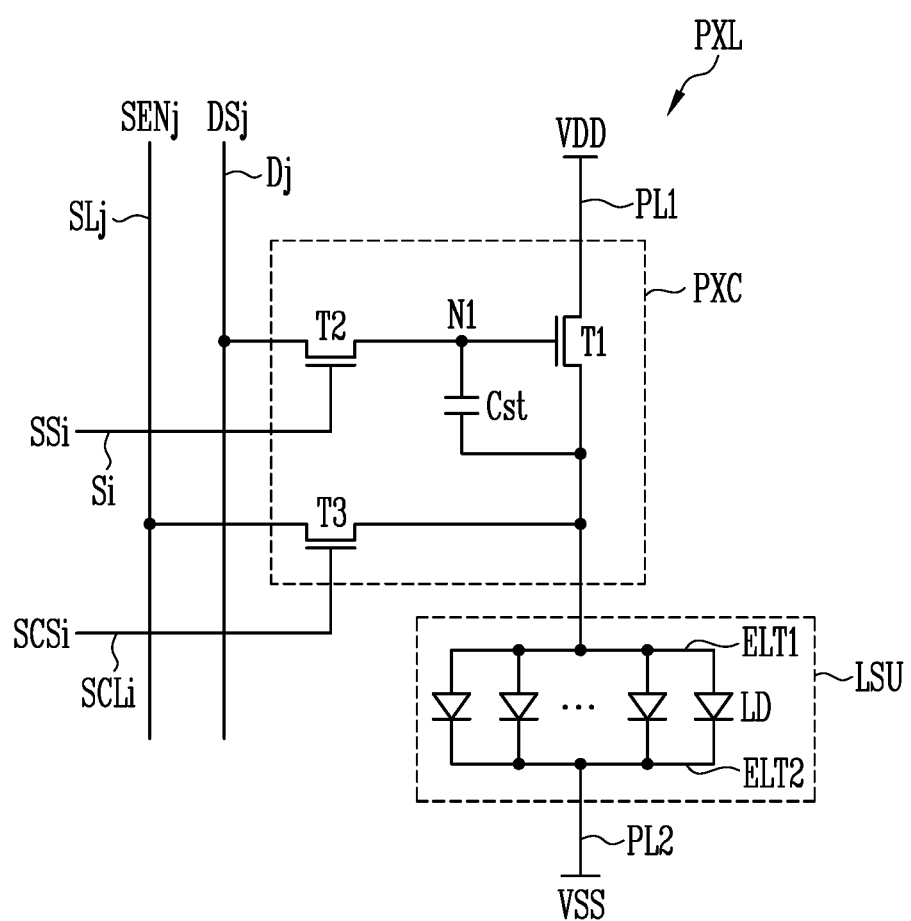
Figure 10:
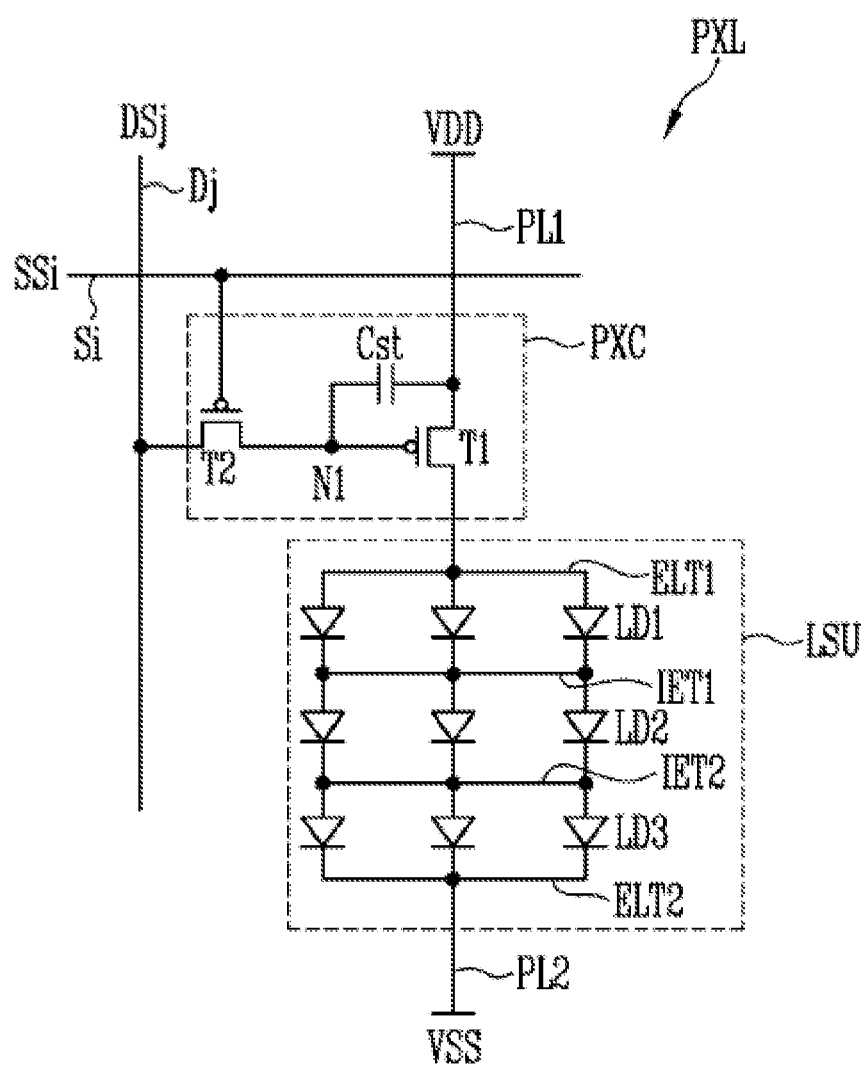

FIG. 8 to FIG. 10 illustrate circuit diagrams of a pixel according to an embodiment. For example, FIG. 8 to FIG. 10 illustrate an embodiment of the pixel PXL applicable to an active display device. However, the types and kinds of the pixel PXL and of the display device are not limited thereto.

In some embodiments, the pixel PXL shown in FIG. 8 to FIG. 10 may be one of the first pixel PXL1, the second pixel PXL2, and the third pixel PXL3 provided in the display panel PNL of FIG. 7. The first pixel PXL1, the second pixel PXL2, and the third pixel PXL3 may have substantially the same or similar structure.

Referring to FIG. 8, the pixel PXL may include a light source unit LSU to generate light at luminance corresponding to a data signal, and a pixel circuit PXC to drive the light source unit LSU.

The light source unit LSU may include at least one light emitting element coupled between a first power source VDD and a second power source VSS. For example, the light source unit LSU may include a first electrode ELT1 (also referred to as a "first pixel electrode" or "first alignment electrode") coupled to the first power VDD via the pixel circuit PXC and a first power line PL1, a second electrode ELT2 (also referred to as a "second pixel electrode" or "second alignment electrode") coupled to the second power VSS through a second power line PL2, and a plurality of light emitting elements LD coupled in the same (e.g., substantially the same) direction between the first and second electrodes ELT1 and ELT2. In the embodiment, the first electrode ELT1 may be an anode electrode, and the second electrode ELT2 may be a cathode electrode.

Each of the light emitting elements LD may include a first end portion (for example, a P-type end portion) coupled to the first power source VDD through the first electrode ELT1 and/or the pixel circuit PXC, and a second end portion (for example, an N-type end portion) coupled to the second power source VSS through the second electrode ELT2. For example, the light emitting elements LD may be coupled in parallel in a forward direction between the first and second electrodes ELT1 and ET2. Respective light emitting elements LD coupled in the forward direction between the first power source VDD and the second power source VSS configure respective effective light sources, and these effective light sources may be combined to configure the light source unit LSU of the pixel PXL.

The first and second power sources VDD and VSS may have different potentials so that the light emitting elements LD may emit light. For example, the first power source VDD may be set as a high potential power source, and the second power source VSS may be set as a low potential power source. In this case, a potential difference between the first and second power source sources VDD and VSS may be set to be equal to or higher than a threshold voltage of the light emitting elements LD during at least a light emitting period of the pixel PXL.

One end portion (for example, P-type end portions) of each of the light emitting elements LD to configure each light source unit LSU may be commonly coupled to the pixel circuit PXC through one electrode (for example, the first pixel electrode ET1 of each pixel PXL) of the light source unit LSU, and may be coupled to the first power source VDD through the pixel circuit PXC and the first power line PL1. The other end portion (for example, N-type end portions) of each of the light emitting elements LD may be commonly coupled to the second power source VSS through the other electrode (for example, the second electrode ELT2 of each pixel PXL) of the light source unit LSU and the second power wire PL2.

The light emitting elements LD may emit light having luminance corresponding to a driving current supplied through the corresponding pixel circuit PXC. For example, during each frame period, the pixel circuit PXC may supply a driving current corresponding to a gray value to be displayed in the corresponding frame to the light source unit LSU. The driving current supplied to the light source unit LSU may be divided to flow in the light emitting elements LD that are coupled in a forward direction. Therefore, while each light emitting element LD emits light having a luminance corresponding to the current flowing therein, the light source unit LSU may emit light having a luminance corresponding to the driving current.

The pixel circuit PXC may be coupled between the first power source VDD and the first electrode ELT1. The pixel circuit PXC may be coupled to a scan line Si and a data line Dj of the pixel PXL. For example, when the pixel PXL is in an i-th horizontal line (row) (i is a natural number) and a j-th vertical line (column) (j is a natural number) of the display area DA, the pixel circuit PXC of the pixel PXL may be coupled to an i-th scan line Si and a j-th data line Dj of the display area DA.

In some embodiments, the pixel circuit PXC may include a plurality of transistors and at least one capacitor. For example, the pixel circuit PXC may include a first transistor T1, a second transistor T2, and a storage capacitor Cst.

The first transistor T1 is coupled between the first power source VDD and the light source unit LSU. For example, a first electrode (for example, a source electrode) of the first transistor T1 may be coupled to the first power source VDD, and a second electrode (for example, a drain electrode) of the first transistor T1 may be coupled to the first electrode ELT1. A gate electrode of the first transistor T1 is coupled to a first node N1. The first transistor T1 controls a driving current supplied to the light source unit LSU in response to a voltage of the first node N1. For example, the first transistor T1 may be a driving transistor that controls a driving current of the pixel PXL.

The second transistor T2 is coupled between the data line Dj and the first node N1. For example, a first electrode (for example, a source electrode) of the second transistor T2 may be coupled to the data line Dj, and a second electrode (for example, a drain electrode) of the second transistor T2 may be coupled to the first node 1. A gate electrode of the second transistor T2 is coupled to the scan line Si. When a scan signal SSi of a gate-on voltage (for example, a low level voltage) is supplied from the scan line Si, the second transistor T2 is turned on to electrically couple the data line Dj and the first node N1.

For each frame period, a data signal DSj of the corresponding frame is supplied to the data line Dj, and the data signal DSj is transmitted to the first node N1 through the turned-on transistor T2 during a period in which the scan signal SSi of the gate-on voltage is supplied. For example, the second transistor T2 may be a switching transistor to transmit each data signal DSj to the inside of the pixel PXL.

One electrode of the storage capacitor Cst is coupled to the first power source VDD, and the other electrode thereof is coupled to the first node N1. The storage capacitor Cst is charged with a voltage the corresponding to the data signal DSj supplied to the first node N1 during each frame period.

In FIG. 8, the transistors included in the pixel circuit PXC, for example, the first and second transistors T1 and T2 are all illustrated as P-type transistors, but are not necessarily limited thereto, and a least one selected from the first and second transistors T1 and T2 may be changed to an N-type transistor. In addition, the pixel circuit PXC may be configured as a pixel circuit having various suitable structures and/or driving methods.

Referring to FIG. 9, the pixel circuit PXC may be further coupled to a sensing control line SCLi and a sensing line SLj. For example, the pixel circuit PXC of the pixel PXL at an i-th horizontal line and a j-th vertical line of the display area DA may be coupled to an i-th sensing control line SCLi and a j-th sensing line SLj of the display area DA. The pixel circuit PXC may further include a third transistor T3. In some embodiments, the sensing line SLj may be omitted, and the characteristics of the pixel PXL may also be detected by detecting a sensing signal SENj through the data line Dj of the corresponding pixel PXL (or adjacent pixel), The third transistor T3 is coupled between the first transistor T1 and the sensing line SLj. For example, one electrode of the third transistor T3 may be coupled to one electrode (for example, a source electrode) of the first transistor T1 coupled to the first electrode ELT1, and the other electrode thereof may be coupled to the sensing line SLj. When the sensing line SLj is omitted, the other electrode of the third transistor T3 may also be coupled to the data line Dj.

A gate electrode of the third transistor T3 is coupled to the sensing control line SCLi. When the sensing control line SCLi is omitted, the gate electrode of the third transistor T3 may be coupled to the scan line Si. The third transistor T3 is turned on by a sensing control signal SCSi of a gate-on voltage (for example, a high level voltage) supplied to the sensing control line SCLi during a set or predetermined sensing period to electrically couple the sensing line SLj and the first transistor T1.

In some embodiments, the sensing period may be a period for extracting characteristics (for example, a threshold voltage of the first transistor T1) of each of the pixels PXL in the display area DA. During the sensing period, the first transistor T1 may be turned on by supplying a set or predetermined reference voltage at which the first transistor T1 may be turned on to the first node N1 through the data line Dj and the second transistor T2 and by coupled each pixel PXL to a current source and/or the like. In addition, by supplying the sensing control signal SCSi of a gate-on voltage to the third transistor T3 to turn on the third transistor T3, the first transistor T1 may be coupled to the sensing line SLj. Thereafter, the sensing signal SENj is obtained through the sensing line SLj, and the characteristics of each pixel PXL in addition to the threshold voltage of the first transistor T1 may be detected by using the sensing signal SENj. Information on the characteristics of each pixel PXL may be used to convert image data so that a characteristic difference between the pixels PXL in the display area DA may be compensated.

FIG. 8 and FIG. 9 illustrate the embodiments in which effective light sources forming each light source unit LSU, for example, the light emitting elements LD are all coupled in parallel, but the present disclosure is not necessarily limited thereto. For example, as shown in FIG. 10, the light source unit LSU of each pixel PXL may be configured to include at least two stages in series. In describing embodiments of FIG. 10, a duplicative description of the configuration (for example, the pixel circuit PXC) that is similar to or the same as the embodiments of FIG. 8 and FIG. 9 will not be repeated here.

Referring to FIG. 10, the light source unit LSU may include at least two light emitting elements coupled in series to each other. For example, the light source unit LSU may include a first light emitting element LD1, a second light emitting element LD2, and a third light emitting element LD3 that are coupled in series in a forward direction between the first power source VDD and the second power source VSS. Each of the first, second, and third light emitting elements LD1, LD2, and LD3 may configure an effective light source.

Hereinafter, when referring to a specific light emitting element among the first, second, and third light emitting elements LD1, LD2, and LD3, the corresponding light emitting element is referred to as a "first light emitting element LD1," "second light emitting element LD2," or "third light-emitting element LD3." In addition, when arbitrarily referring to at least one light emitting element among the first, second, and third light emitting elements LD1, LD2, and LD3, or generically referring to the first, second, and third light emitting elements LD1, LD2, and LD3, it will be referred to as "light emitting element LD" or "light emitting elements LD."

A first end portion (for example, P-type end portion) of the first light emitting element LD1 is coupled to the first power source VDD via the first electrode ELT1 (e.g., first pixel electrode) of the light source unit LSU. In addition, a second end portion (for example, N-type end portion) of the first light emitting element LD1 is coupled to a first end portion (for example, P-type end portion) of the second light emitting element LD2 through a first middle electrode IET1.

The first end portion of the second light emitting element LD2 is coupled to a second end portion of the first light emitting element LD1. In addition, the second end portion (for example, N-type end) of the second light emitting element LD2 is coupled to a first end portion (for example, P-type end portion) of the third light emitting element LD3 through a second middle electrode IET2.

The first end portion of the third light emitting element LD3 is coupled to a second end portion of the second light emitting element LD2. In addition, a second end portion of the third light emitting element LD3 (for example, N-type end portion) may be coupled to the second power supply VSS via the second electrode (e.g., second pixel electrode ELT2) of the light source unit LSU. In the above-described manner, the first, second, and third light emitting elements LD1, LD2, and LD3 may be sequentially coupled in series between the first and second electrodes ELT1 and ELT2 of the light source unit LSU.

FIG. 10 illustrates an embodiment that couples the light emitting elements LD in a three-stage serial structure, but the present disclosure is not limited thereto, and two light emitting elements LD may be coupled in a two-stage serial structure, or four or more of light emitting elements LD may be coupled in a series structure having four or more stages.

Assuming that the same luminance is expressed using the light-emitting elements LD of the same condition (for example, the same size and/or number), in the light source unit LSU having a structure in which the light emitting elements LD are coupled in series compared to the light source unit LSU having a structure in which the light emitting elements LD are coupled in parallel, a voltage applied between the first and second electrodes ELT1 and ELT2 may increase, a driving current flowing through the light source unit LSU may decrease. Therefore, when the light source unit LSU of each pixel PXL is configured by applying the serial structure, a panel current flowing through the display panel PNL may be reduced.

As in the above-described embodiment, each light source unit LSU is coupled to the first and second power sources VDD and VSS in a forward direction to be able to include a plurality of light emitting elements LD to configure each effective light source. In addition, the connection structure between the light emitting elements LD may be variously changed according to embodiments. For example, the light emitting elements LD may be coupled to each other only in series or in parallel, or may be coupled in a series/parallel mixed structure.

Figure 11:
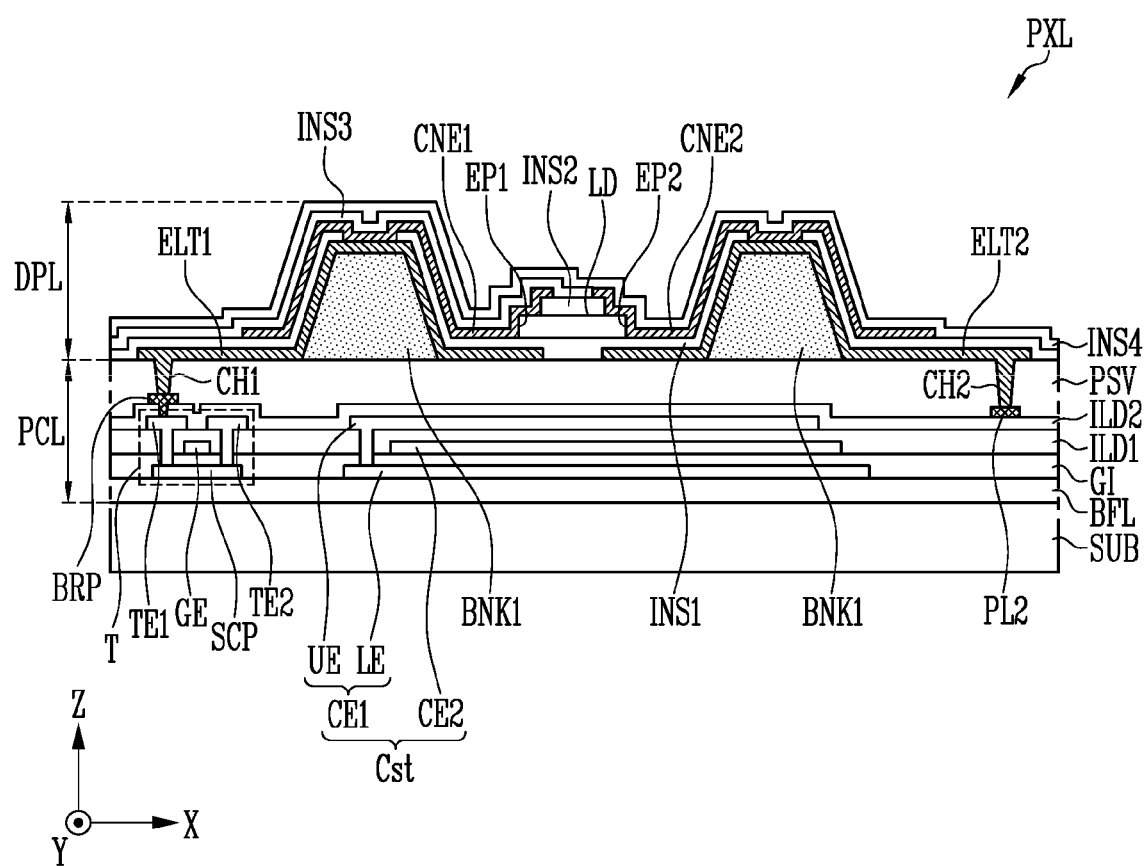
FIG. 11 and FIG. 12 are cross-sectional views of a pixel according to an embodiment.
Figure 12:
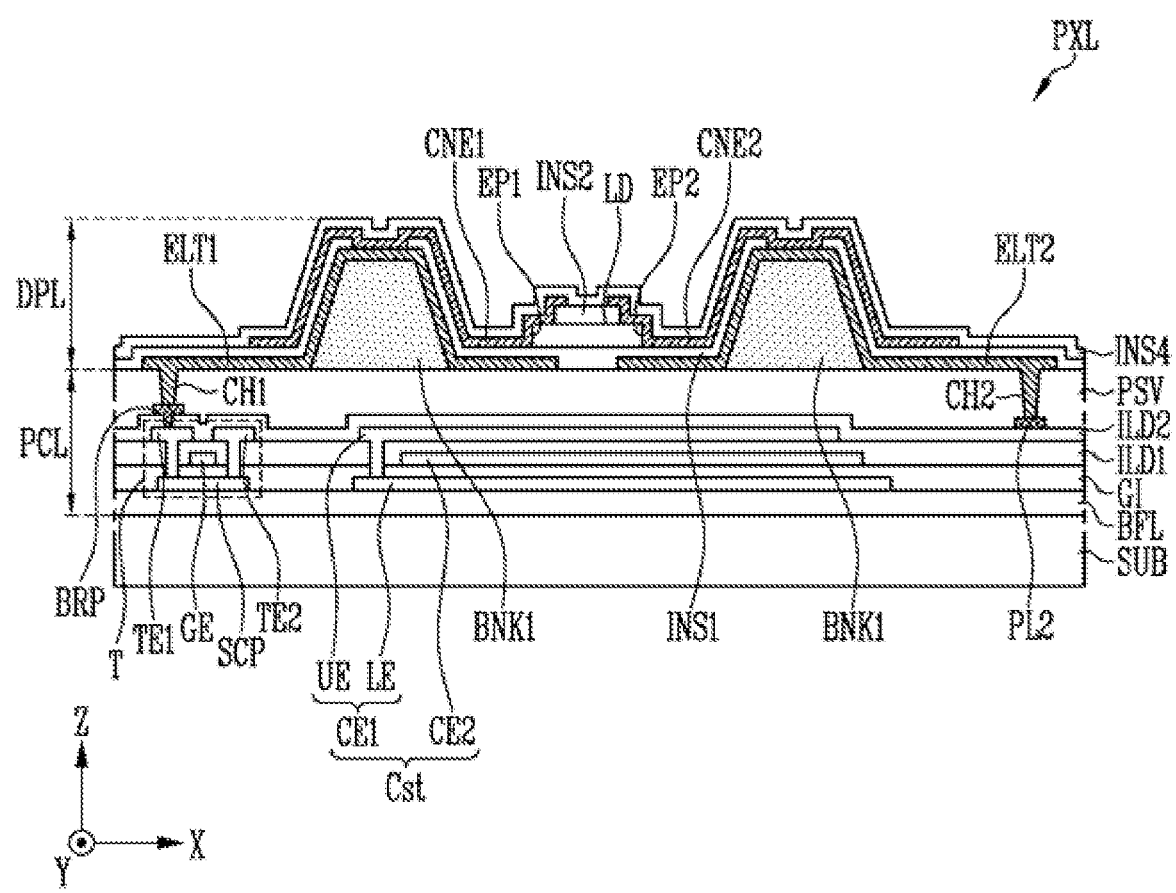

FIG. 11 and FIG. 12 are cross-sectional views of a pixel according to an embodiment.

FIG. 11 and FIG. 12 schematically illustrate the structure of each pixel PXL based on one light emitting element LD, respectively, and illustrate a transistor T (for example, the first transistor T1 in FIG. 8) and the storage capacitor Cst coupled to the first electrode ELT1 for showing various suitable circuit elements to configure the pixel circuit PXC, respectively. Hereinafter, when it is not necessary to separately specify the first transistor T1, the first transistor T1 will also be referred to as a "transistor T."

Structures of the transistors T and the storage capacitor Cst and/or a position of each layer thereof are not limited to the embodiments shown in FIG. 11 and FIG. 12, and may be variously changed according to embodiments. In addition, in some embodiments, the transistors T included in each pixel circuit PXC may have substantially the same or similar structure to each other, but are not limited thereto. For example, in some embodiments, at least one of the transistors T included in the pixel circuit PXC may have a different cross-sectional structure from the remaining other transistors T, and/or may be on a different layer.

Referring to FIG. 11 and FIG. 12, the pixel PXL and the display device including the same may include a substrate SUB, a circuit layer PCL on one surface of the substrate SUB, and a display layer DPL on the circuit layer.

The circuit layer PCL may include circuit elements to configure the pixel circuit PXC of each pixel PXL, and various suitable wires coupled to the circuit elements. The display layer DPL may include electrodes (for example, the first and second electrodes ELT1 and ELT2 and/or the first and second contact electrodes CNE1 and CNE2) and the light emitting elements LD, to configure the light source unit LSU of each pixel PXL.

The circuit layer PCL may include at least one circuit element electrically coupled to the light emitting elements LD of each pixel PXL. For example, the circuit layer PCL may include a plurality of transistors T and a storage capacitor Cst that are in each pixel area to form a pixel circuit PXC of a corresponding pixel PXL. In addition, the circuit layer PCL may further include at least one power wire and/or signal wire coupled to each pixel circuit PXC and/or light source unit LSU. For example, the circuit layer PCL may include the first power wire PL1, the second power wire PL2, and the scan line Si and the data line Dj of each pixel PXL. On the other hand, when the pixel circuit PXC is omitted and the light source unit LSU of each pixel PXL is directly coupled to the first and second power wires PL1 and PL2 (or set or predetermined signal wires), the circuit layer PCL may be omitted.

In addition, the circuit layer PCL may include a plurality of insulation layers. For example, the circuit layer PCL may include a buffer layer BFL, a gate insulation layer GI, a first interlayer insulation layer ILD1, a second interlayer insulation layer ILD2, and/or a passivation layer PSV, sequentially stacked on one side of the substrate SUB. In addition, the circuit layer PCL may selectively further include at least one light blocking pattern and the like under at least some of the transistors T.

The buffer layer BFL may prevent or reduce diffusion of impurities into each circuit element. The buffer layer BFL may be formed as a single layer, but may also be formed as a multilayer of at least two layers or more. When the buffer layer BFL is provided as the multilayer, respective layers may include the same (e.g., substantially the same) material or different materials. Various suitable circuit elements such as the transistors T and the storage capacitor Cst, and various suitable wires coupled to the circuit elements may be on the buffer layer BFL. In some embodiments, the buffer layer BFL may be omitted. In this case, at least one circuit element and/or wire may be directly on one surface of the substrate SUB.

Each transistor T may include a semiconductor pattern SCP (also referred to as a "semiconductor layer" or "active layer"), a gate electrode GE, first and second transistor electrodes TE1 and TE2. FIG. 11 and FIG. 12 illustrate an embodiment in which each transistor T includes the first and second transistor electrodes TE1 and TE2 formed separately from the semiconductor pattern SCP, but the present disclosure is not necessarily limited thereto. For example, in another embodiment, the first and/or second transistor electrodes TE1 and/or TE2 provided in at least one transistor T may be integrated with each semiconductor pattern SCP.

The semiconductor pattern SCP may be on the buffer layer BFL. For example, the semiconductor pattern SCP may be between the substrate SUB on which the buffer layer BFL is formed and the gate insulation layer GI. The semiconductor pattern SCP may include a first region contacting (e.g., physically contacting) each first transistor electrode TE1, a second region contacting (e.g., physically contacting) each second transistor electrode TE2, and a channel region between the first and second regions. In some embodiments, one selected from the first and second regions may be a source region, and the other thereof may be a drain region.

In some embodiments, the semiconductor pattern SCP may be a semiconductor pattern including polysilicon, amorphous silicon, an oxide semiconductor, and/or the like. In addition, the channel region of the semiconductor pattern SCP may be an intrinsic semiconductor as a semiconductor pattern that is not doped with impurities, and each of the first and second regions of the semiconductor pattern SCP may be a semiconductor pattern doped with set or predetermined impurities.

In the embodiment, the semiconductor patterns SCP of the transistors T included in each pixel circuit PXC may include substantially the same or similar material. For example, the semiconductor pattern SCP of the transistors T may include at least one material selected from polysilicon, amorphous silicon, and an oxide semiconductor.

In another embodiment, some of the transistors T and the remaining some thereof may include the semiconductor patterns SCP including different materials. For example, the semiconductor pattern SCP of some of the transistors T may include polysilicon and/or amorphous silicon, and the semiconductor pattern SCP of the remaining some of the transistors T may include an oxide semiconductor.

The gate insulation layer GI may be on the semiconductor pattern SCP. For example, the gate insulation layer GI may be between the semiconductor pattern SCP and the gate electrode GE. The gate insulation layer GI may be formed as a single layer or multilayer, and may include a silicon nitride (SiNx), a silicon oxide (SiOx), and/or a silicon oxynitride (SiOxNy), and various suitable types or kinds of organic/inorganic insulating materials.

The gate electrode GE may be on the gate insulation layer GI. For example, the gate electrode GE may overlap the semiconductor pattern SCP with the gate insulation layer GI interposed therebetween. FIG. 11 and FIG. 12 illustrate a top-gate structure of transistor T, but in another embodiment, the transistor T may have a bottom-gate structure. In this case, the gate electrode GE may overlap the semiconductor pattern SCP under the semiconductor pattern SCP.

The first interlayer insulation layer ILD1 may be on the gate electrode GE. For example, the first interlayer insulation layer ILD1 may be between the gate electrode GE and the first and second transistor electrodes TE1 and TE2. The first interlayer insulation layer ILD1 may be formed as a single layer or multilayer, and may include at least one inorganic insulating material and/or organic insulating material. For example, the first interlayer insulation layer ILD1 may include a silicon nitride (SiNx), a silicon oxide (SiOx), and/or a silicon oxynitride (SiOxNy), and various suitable types or kinds of organic/inorganic insulating materials, and the materials included in the first interlayer insulation layer ILD1 are not particularly limited.

The first and second transistor electrodes TE1 and TE2 may be on each semiconductor pattern SCP with at least one first interlayer insulation layer ILD1 therebetween. For example, the first and second transistor electrodes TE1 and TE2 may be on different end portions of the semiconductor pattern SCP with the gate insulation layer GI and the first interlayer insulation layer ILD1 therebetween. The first and second transistor electrodes TE1 and TE2 may be electrically coupled to each semiconductor pattern SCP. For example, the first and second transistor electrodes TE1 and TE2 may be coupled to the first and second regions of the semiconductor pattern SCP through respective contact holes passing through the gate insulation layer GI and the first interlayer insulation layer ILD1. In some embodiments, one selected from the first and second transistor electrodes TE1 and TE2 may be a source electrode, and the other thereof may be a drain electrode.

At least one transistor T provided in the pixel circuit PXC may be coupled to at least one pixel electrode. For example, the transistor T may be electrically coupled to the first electrode ELT1 of the corresponding pixel PXL through a contact hole (for example, first contact hole CH1) and/or bridge pattern BRP passing through the passivation layer PSV.

The storage capacitor Cst includes a first capacitor electrode CE1 and a second capacitor electrode CE2 overlapping each other. Each of the first and second capacitor electrodes CE1 and CE2 may be configured of a single layer or multilayer. In addition, at least one selected from the first and second capacitor electrodes CE1 and CE2 may be on the same layer as at least one electrode or the semiconductor pattern SCP to configure the first transistor T1.

For example, the first capacitor electrode CE1 may be configured as a multilayer electrode that includes a lower electrode LE on the same layer as the semiconductor pattern SCP of the first transistor T1, and an upper electrode UE on the same layer as the first and second transistor electrodes TE1 and TE2 of the first transistor T1 and electrically coupled to the lower electrode LE. The second capacitor electrode CE2 may be configured as a single layer electrode that is on the same layer as the gate electrode of the first transistor T1 and is between the lower electrode LE and the upper electrode UE of the first capacitor electrode CE1. However, the structure and/or position of each of the first and second capacitor electrodes CE1 and CE2 may be variously changed. For example, one selected from the first and second capacitor electrodes CE1 and CE2 may include a conductive pattern on a layer different from the electrodes (for example, the gate electrode GE, and the first and second transistor electrodes TE1 and TE2) and the semiconductor pattern SCL that configure the first transistor T1. For example, the first capacitor electrode CE1 or the second capacitor electrode CE2 may have a single-layered or multi-layered structure including a conductive pattern on the second interlayer insulation layer ILD2.

In the embodiment, at least one signal wire and/or power wire coupled to each pixel PXL may be on the same layer as one electrode of circuit elements included in the pixel circuit PXC. For example, the scan line Si of each pixel PXL may be on the same layer as the gate electrodes GE of transistors T, and the data line Dj of each pixel PXL may be on the same layer as the first and second transistor electrodes TE1 and TE2 of transistors T.

The first and/or second power wires PL1 and PL2 may be on the same layer as or different layers from the gate electrodes GE or first and second transistor electrodes TE1 and TE2 of the transistors T. For example, the second power wire PL2 for supplying the second power source VSS may be on the second interlayer insulation layer ILD2 to be at least partially covered by the passivation layer PSV. The second power wire PL2 may be electrically coupled to the second electrode ELT2 of the light source unit LSU on the passivation layer PSV through the second contact hole CH2 passing through the passivation layer PSV. However, the position and/or structure of the first and/or second power wires PL1 and PL2 may be variously changed. For example, the second power line PL2 may be on the same layer as the gate electrodes GE of the transistors T or the first and second transistor electrodes TE1 and TE2 to be electrically coupled to the second electrode ELT2 through at least one bridge pattern and/or the second contact hole CH2.

The second interlayer insulation layer ILD2 may be at an upper portion of the first interlayer insulation layer ILD1, and may cover the first and second transistor electrodes TE1 and TE2 and/or storage capacitor Cst on the first interlayer insulation layer ILD1. The second interlayer insulation layer ILD2 may be formed as a single layer or multilayer, and may include at least one inorganic insulating material and/or organic insulating material. For example, the second interlayer insulation layer ILD2 may include a silicon nitride (SiNx), a silicon oxide (SiOx), and/or a silicon oxynitride (SiOxNy), and various suitable types or kinds of organic/inorganic insulating materials, but is not particularly limited thereto.

The bridge pattern BRP, the first power wire PL1, and/or the second Power wire PL2 for coupling at least one circuit element (for example, the first transistor T1) provided in the pixel circuit PXC to the first electrode ELT1 may be on the second interlayer insulation layer ILD2. However, in some embodiments, the second interlayer insulation layer ILD2 may be omitted. In this case, the bridge pattern BRP of FIG. 11 and FIG. 12 may be omitted, and the second power wire PL2 may be on a layer in which one electrode of the transistor T is located.

The passivation layer PSV may be on the circuit elements including the transistors T and the storage capacitor Cst, and/or on the wires including the first and second power wires PL1 and PL2. The passivation layer PSV may be formed as a single layer or multilayer, and may include at least one inorganic insulating material and/or organic insulating material. For example, the passivation layer PSV may include at least one organic insulation layer, and may serve to substantially flatten a surface of the circuit layer PCL.

The display layer DPL may be on the passivation layer PSV of the circuit layer PCL. The display layer DPL may include at least one pair of first electrodes ELT1 and second electrode ELT2 in the light emitting area of each pixel PXL and to configure each light source unit LSU, and at least one light emitting element LD coupled between the first electrode ELT1 and the second electrode ELT2. On the other hand, FIG. 11 and FIG. 12 each illustrates one light emitting element LD in each pixel PXL, but each pixel PXL may include a plurality of light emitting elements LD coupled between the first and second electrodes ELT1 and ELT2 as in the embodiments of FIG. 8. Accordingly, hereinafter, assuming that the pixel PXL includes a plurality of light emitting elements LD, each embodiment will be described.

In addition, the display layer DPL may further include the first and second contact electrodes CNE1 and CNE2 for more stably coupling the light emitting elements LD between the first and second electrodes ELT1 and ELT2, and a bank BNK1 for upwardly protruding one area of each of the first and second electrodes ELT1 and ELT2 and/or the first and second contact electrodes CNE1 and CNE2. In addition, the display layer DPL may further include at least one conductive layer and/or an insulation layer.

The bank BNK1 may be on the circuit layer PCL. The banks BNK1 may be formed in a separate or integral pattern. The bank BNK1 may protrude in a height direction of the substrate SUB, for example, a third direction (Z-axis direction).

The bank BNK1 may have various suitable shapes according to embodiments. In the embodiment, the bank BNK1 may be a bank structure having a positive taper structure. For example, the bank BNK1 may be formed to have an inclined surface inclined at a set or predetermined angle with respect to the substrate SUB. However, the present disclosure is not necessarily limited thereto, and the bank BNK1 may have a side wall having a curved surface or a step shape. For example, the bank BNK1 may have a cross-section of a semicircle or semi-ellipse shape.

Electrodes and insulation layers at an upper portion of bank BNK1 may have a shape corresponding to the bank BNK1. For example, the first and second electrodes ELT1 and ELT2, and the first and second contact electrodes CNE1 and CNE2 may be on an area of the bank BNK1, and may include an inclined or curved surface having a shape corresponding to the shape of the bank BNK1. Similarly, first, third, and/or fourth insulation layers INS1, INS3, and INS4 may be on the bank BNK1 to include inclined surfaces or curved surfaces having a shape corresponding to the shape of the bank BNK1.

The bank BNK1 may contain an insulating material including at least one inorganic material and/or an organic material. For example, the bank BNK1 may include at least one layer of inorganic film that includes various suitable inorganic insulating materials including a silicon nitride (SiNx) and/or a silicon oxide (SiOx). In some embodiments, the bank BNK1 may include at least one layer of organic film and/or photo resist film that include various suitable organic insulating materials, or may include a single-layered or multi-layered insulator complexly including organic/inorganic materials. For example, the material and/or pattern shape of the bank BNK1 may be variously changed.

In some embodiments, the bank BNK1 may function as a reflective member. For example, the bank BNK1, along with the first and second electrodes ELT1 and ELT2 provided thereon, may function as a reflective member that guides the light emitted from each light emitting element LD in a desired direction (for example, an upper direction of the pixel PXL) to improve the light efficiency of the pixel PXL.

The first and second electrodes ELT1 and ELT2 included in the pixel electrodes of each pixel PXL may be at the upper portion of the bank BNK1. The first electrode ELT1 and the second electrode ELT2 may be in each pixel area in which each PXL is provided and/or formed. For example, the first electrode ELT1 and the second electrode ELT2 may be in the light emitting area of each pixel PXL. The first and second electrodes ELT1, and ELT2 may be spaced apart from each other. For example, the first and second electrodes ELT1 and ELT2 may be spaced apart side by side by a set or predetermined interval in each light emitting area.

In some embodiments, the first and/or second electrodes ELT1 and ELT2 may have a pattern separated for each pixel PXL or a pattern that is commonly coupled to a plurality of pixels PXL. On the other hand, before the process of forming the pixel PXL, for example, before the alignment of the light emitting elements LD is completed, the first electrodes ELT1 of the pixels PXL in the display area DA are coupled to each other, and the second electrodes ELT2 of the pixels PXL may be coupled to each other. For example, before the alignment of the light emitting elements LD is completed, the first electrodes ELT1 of the pixels PXL may formed integrally or non-integrally with each other and may be electrically coupled to each other, and the second electrodes ELT2 of the pixels PXL may be formed integrally or non-integrally with each other and may be electrically coupled to each other. When the first electrodes ELT1 or the second electrodes ELT2 of the pixels PXL are non-integrally coupled to each other, the first electrodes ELT1 or the second electrodes ELT2 may be electrically coupled to each other by at least one contact hole and/or bridge pattern.

The first and second electrodes ELT1 and ELT2 may receive a first alignment signal (or first alignment voltage) and a second alignment signal (or second alignment voltage), respectively, in an alignment step of the light emitting elements LD. For example, one selected from the first and second electrodes ELT1 and ELT2 may be supplied with an AC-type alignment signal, and the other of the first and second electrodes ELT1 and ELT2 may be supplied with an alignment voltage (for example, a ground voltage) having a constant voltage level. For example, a set or predetermined alignment signal may be applied to the first and second electrodes ELT1 and ELT2 in the alignment step of the light emitting elements LD. Accordingly, an electric field may be formed between the first and second electrodes ELT1 and ELT2. The light emitting elements LD provided in the light emitting area of each pixel PXL may be self-aligned between the first and second electrodes ELT1 and ELT2 by the electric field. After the alignment of the light emitting elements LD is completed, by disconnecting the at least first electrodes ELT1 between the pixels PXL, the pixels PXL may be formed in a form capable of being individually driven.

The first electrode ELT1 may be electrically coupled to a set or predetermined circuit element (for example, at least one transistor to configure the pixel circuit PXC), a power line (for example, the first power line PL1), and/or a signal line (for example, the scan line Si, the data line Dj, or a set or predetermined control line), through a first contact hole CH1. In the embodiment, the first electrode ELT1 may be electrically coupled to the bridge pattern BRP through the first contact hole CH1, and thus, it may be electrically coupled to the transistor T. However, the present disclosure is not necessarily limited thereto, and the first electrode ELT1 may be directly coupled to a set or predetermined power wire and/or signal wire.

The second electrode ELT2 may be electrically coupled to a set or predetermined circuit element (for example, at least one transistor to configure the pixel circuit PXC), a power line (wire) (for example, the second power line (wire) PL2), and/or a signal line (for example, the scan line Si, the data line Dj, or a set or predetermined control line), through a second contact hole CH2. In the embodiment, the second electrode ELT2 may be electrically coupled to the second power wire PL2 through the second contact hole CH2. However, the present disclosure is not necessarily limited thereto, and the second electrode ELT2 may be directly coupled to a set or predetermined power wire and/or signal wire.

Each of the first and second electrodes ELT1 and ELT2 may contain at least one conductive material (e.g., electrically conductive material). For example, each of the first and second electrodes ELT1 and ELT2 may include at least one metal selected from various suitable metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and an alloy including the same; a conductive oxide such as an indium tin oxide (ITO), an indium zinc oxide (IZO), an indium tin zinc Oxide (ITZO), a zinc oxide (ZnO), an aluminum zinc oxide (AZO), a gallium zinc oxide (GZO), a zinc tin oxide (ZTO), a gallium tin oxide (GTO), and a fluorine tin oxide (FTO); and at least one conductive material among conductive polymers such as PEDOT, but the present disclosure is not limited thereto. For example, each of the first and second electrodes ELT1 and ELT2 may contain other conductive materials such as, for example, a carbon nanotube and/or graphene. In addition, each of the first and second electrodes ELT1 and ELT2 may be configured of a single layer or multilayer. For example, each of the first and second electrodes ELT1 and ELT2 may include a reflective electrode layer containing a reflective conductive material. In addition, each of the first and second electrodes ELT1 and ELT2 may selectively further include at least one transparent electrode layer at an upper portion and/or a lower portion of the reflective electrode layer and at least one conductive capping layer covering an upper portion of the reflective electrode layer and/or the transparent electrode layer.

The first insulation layer INS1 may be on one area of the first and second electrodes ELT1 and ELT2. For example, the first insulation layer INS1 may cover one area of each of the first and second electrodes ELT1 and ELT2, and may include an opening exposing the other area of each of the first and second electrodes ELT1 and ELT2. For example, the first insulation layer INS1 may include an opening on an upper surface of the bank BNK1. In the area in which the first insulation layer INS1 is opened, the first and second electrodes ELT1 and ELT2 may be electrically coupled to the first and second contact electrodes CNE1 and CNE2, respectively. In some embodiments, the first insulation layer INS1 may be omitted. In this case, the light emitting elements LD may be directly on the passivation layer PSV and/or one end of each of first and second electrodes ELT1 and ELT2.

In some embodiments, the first insulation layer INS1 may be first formed to entirely cover the first and second electrodes ELT1 and ELT2. After the light emitting elements LD are supplied and arranged on the first insulation layer INS1, the first insulation layer INS1 may be partially opened to expose one area of the first and second electrodes ELT1 and ELT2. For example, the insulation layer INS1 has an opening exposing one area of the first and second electrodes ELT1 and ELT2 on an upper surface of the first bank BNK1, and may at least partially cover the inclined or curved surfaces of the first and second electrodes ELT1 and ELT2. In some embodiments, the first insulation layer INS1 may be patterned in a form of an individual pattern that is locally only under the light emitting elements LD after the light emitting elements LD are completely supplied and arranged. The first insulation layer INS1 may be formed to cover the first and second electrodes ELT1 and ELT2 after the first and second electrodes ELT1 and ELT2 are formed. Accordingly, it is possible to prevent or reduce damage to the first and second electrodes ELT1 and ELT2 in a subsequent process.

The first insulation layer INS1 may be formed as a single layer or multilayer, and may include at least one inorganic insulating material and/or organic insulating material. For example, the first insulation layer INS1 may include a silicon nitride (SiNx), a silicon oxide (SiOx), a silicon oxynitride (SiOxNy), and/or an aluminum oxide (AlOx), and/or various suitable types or kinds of organic/inorganic insulating materials.

The light emitting elements LD may be provided and arranged on the first and second electrodes ELT1 and ELT2 and the first insulation layer INS1. The light emitting elements LD may be supplied to each pixel area PXA in which the bank BNK1, the first and second electrodes ELT1 and ELT2, and the first insulation layer are formed to be arranged between the first and second electrodes ELT1 and ELT2. For example, a plurality of light emitting elements LD may be supplied to the light emitting area of each pixel PXL through an inkjet method, a slit coating method, and/or various suitable other methods, and the light emitting elements LD may be aligned between the first and second electrodes ELT1 and ELT2 with directionality by a set or predetermined alignment signal (or alignment voltage) applied to each of the first and second electrodes ELT1 and ELT2.

In some embodiments, at least some of the light emitting elements LD may be between the pair of first and second electrodes ELT1 and ELT2 so that both end portions thereof (e.g., the first and second end portions EP1 and EP2) overlap an adjacent pair of first and second electrodes ELT1 and ELT2. In another embodiment, at least some of the light emitting elements LD may not overlap the first and/or second electrodes ELT1 and ELT2 between a pair of adjacent first and second electrodes ELT1 and ELT2, and may be electrically coupled to the pair of first and second electrodes ELT1 and ELT2 through the first and second contact electrodes CNE1 and CNE2, respectively. Each light emitting element LD electrically coupled between the first and second electrodes ELT1 and ELT2 may form an effective light source of the corresponding pixel PXL. The effective light sources may configure the light source unit LSU of the corresponding pixel PXL.

The second insulation layer INS2 may be on one area of the light emitting elements LD. For example, the second insulation layer INS2 may be on one area of each of the light emitting elements LD to expose the first and second end portions EP1 and EP2 of each of the light emitting elements LD. For example, the second insulation layer INS2 may be locally at an upper portion of one area including a central area of each of the light emitting elements LD. When the second insulation layer INS2 is formed on the light emitting elements LD after the alignment of the light emitting elements LD is completed, it is possible to prevent or reduce deviation of the light emitting elements LD from an aligned position.

The second insulation layer INS2 may be formed in an independent pattern in the light emitting area of each pixel PXL, but is not limited thereto. In some embodiments, the second insulation layer INS2 may be omitted, and in this case, one end of each of the first and second contact electrodes CNE1 and CNE2 may be directly on the upper surface of the light emitting elements LD.

The second insulation layer INS2 may be formed as a single layer or multilayer, and may include at least one inorganic insulating material and/or organic insulating material. For example, the second insulation layer INS2 may include a silicon nitride (SiNx), a silicon oxide (SiOx), a silicon oxynitride (SiOxNy), an aluminum oxide (AlOx), a photo resist, and/or various suitable types or kinds of organic/inorganic insulating materials.

Both end portions of the light emitting elements LD that are not covered by the second insulation layer INS2, for example, the first and second end portions EP1 and EP2, may be covered by the first and second contact electrodes CNE1 and CNE2 respectively. The first and second contact electrodes CNE1 and CNE1 may be spaced apart from each other. For example, the adjacent first and second contact electrodes CNE1 and CNE2 may be spaced apart from each other on the first and second end portions EP1 and EP2 of at least one adjacent to the light emitting element LD, with the second insulation layer INS2 therebetween.

In addition, the first and second contact electrodes CNE1 and CNE2 may be at the upper position of the first and second electrodes ELT1 and ELT2 to cover the exposed area of each of the first and second electrodes ELT1 and ELT2. For example, the first and second contact electrodes CNE1 and CNE2 may be on at least one area of each of the first and second electrodes ELT1 and ELT2 so as to be in direct or indirect contact with each of the first and second electrodes ELT1 and ELT2 at the upper portion of the bank BNK1 or around the bank BNK1. Accordingly, the first and second contact electrodes CNE1 and CNE2 may be electrically coupled to the first and second electrodes ELT1 and ELT2, respectively. For example, the first and second electrodes ELT1 and ELT2 may be electrically coupled to the first or second end portions EP1 and EP2 of at least one light emitting element LD adjacent thereto through the first and second contact electrodes CNE1 and CNE2, respectively.

In some embodiments, the first and second contact electrodes CNE1 and CNE2 may be sequentially formed in different layers on one surface of the substrate SUB as shown in FIG. 11. In this case, the third insulation layer INS3 may be between the first contact electrode CNE1 and the second contact electrode CNE2. The order of formation of the first and second contact electrodes CNE1 and CNE2 may vary according to embodiments. For example, in some embodiments, before the first contact electrode CNE1 is formed, the second contact electrode CNE2 is first formed, and the third insulation layer INS3 is formed to cover the second contact electrode CNE2 and the second insulation layer INS2, and then the first contact electrode CNE1 may be formed on the third insulation layer INS3. However, the present disclosure is not necessarily limited thereto, and the first and second contact electrodes CNE1 and CNE2 may be on the same layer as shown in FIG. 12. For example, the first and second contact electrodes CNE1 and CNE2 may be formed of the same conductive layer on one surface of the substrate SUB. In this case, because the first and second contact electrodes CNE1 and CNE2 may be concurrently (e.g., simultaneously) formed in the same (e.g., substantially the same) process, a manufacturing process of the pixel PXL and the display device including the same may be simplified. However, the present disclosure is not necessarily limited thereto, and the first and second contact electrodes CNE1 and CNE2 may be sequentially formed.

The first and second contact electrodes CNE1 and CNE2 may include various suitable transparent conductive materials. For example, the first and second contact electrodes CNE1 and CNE2 may include at least one of various suitable transparent materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), and/or a fluorine tin oxide (FTO), and they may be implemented to be substantially transparent or translucent to satisfy a set or predetermined transmittance. Accordingly, the light emitted from the light emitting elements LD through each of the first and second end portions EP1 and EP2 may pass through the first and second contact electrodes CNE1 and CNE2 to be emitted to the outside of the display panel PNL.

The third insulation layer INS3 may be between the first contact electrode CNE1 and the second contact electrode CNE2. As such, when the third insulation layer INS3 is formed between the first contact electrode CNE1 and the second contact electrode CNE2, it is possible to secure electrical stability between the first and second end portions EP1 and EP2 of the light emitting elements LD. For example, the first and second contact electrodes CNE1 and CNE2 may be stably separated by the third insulation layer INS3. Accordingly, it is possible to effectively prevent a short circuit defect from occurring between the first and second end portions EP1 and EP2 of the light emitting elements LD (or to reduce a likelihood or degree of such a short circuit).

The third insulation layer INS3 may be formed as a single layer or multilayer, and may include at least one inorganic insulating material and/or organic insulating material. For example, the third insulation layer INS3 may include a silicon nitride (SiNx), a silicon oxide (SiOx), a silicon oxynitride (SiOxNy), and/or an aluminum oxide (AlOx), and/or various suitable types or kinds of organic/inorganic insulating materials.

A fourth insulation layer INS4 may be on the first and second contact electrodes CNE1 and CNE2 and/or the third insulation layer INS3. For example, the fourth insulation layer INS4 may cover the banks BNK1, the first and second electrodes ELT1 and ELT2, the first, second, and/or third insulation layers INS1, INS2, and/or INS3, and the light emitting elements LD, and the first and second contact electrodes CNE1 and CNE2. The fourth insulation layer INS4 may include at least one layer of an inorganic layer and/or organic layer.

The fourth insulation layer INS4 may be formed as a single layer or multilayer, and may include at least one inorganic insulating material and/or organic insulating material. For example, the fourth insulation layer INS4 may include a silicon nitride (SiNx), a silicon oxide (SiOx), a silicon oxynitride (SiOxNy), and/or an aluminum oxide (AlOx), and/or various suitable types or kinds of organic/inorganic insulating materials.

In the embodiment, the fourth insulation layer INS4 may include a thin film encapsulation layer of a multi-layered structure. For example, the fourth insulation layer INS4 may include a thin film encapsulation layer of a multi-layered structure that includes at least two inorganic insulation layers and at least one organic insulation layer interposed between the at least two inorganic insulation layers. However, the present disclosure is not necessarily limited thereto, and the material and/or structure of the fourth insulation layer INS4 may be variously changed.

Those skilled in the art related to the present embodiment will readily appreciate that many modifications are possible without materially departing from the spirit and scope of the present disclosure. The embodiments should be considered in a descriptive sense only and not for purposes of limitation. The scope of the present disclosure, not by the detailed description given in the appended claims, and all differences within the equivalent scope will be construed as being included in the present disclosure.

What is claimed is:
1. A light emitting element, comprising:
a first semiconductor layer, a second semiconductor layer, and an active layer between the first semiconductor layer and the second semiconductor layer;
a passivation layer surrounding an outer surface of at least one selected from the first semiconductor layer, the second semiconductor layer, and the active layer; and
an insulation layer surrounding an outer surface of the passivation layer,
wherein the passivation layer comprises a two-dimensional (2D) material, and
wherein the 2D material comprises at least one selected from $CaF_2$, $Ti_{0.9}O_2$, Mica, $WS_2$, $MoS_2$, $Ni(OH)_2$, $Cu(OH)_2$, $Mg(OH)_2$, GaS, and Talc, and
wherein the passivation layer comprises a plurality of passivation layers spaced apart from each other in a length direction of the light emitting element on the outer surface of the at least one selected from the first semiconductor layer, the second semiconductor layer, and the active layer.

2. The light emitting element of claim 1, wherein:
a band gap of the 2D material is 3.5 eV or more.

3. The light emitting element of claim 1, wherein:
the passivation layer is partially on an outer surface of the first semiconductor layer, the second semiconductor layer, and/or the active layer, and an outer surface of the first semiconductor layer, the second semiconductor layer, and/or the active layer exposed by the passivation layer is in contact with the insulation layer.

4. The light emitting element of claim 1, wherein:
the passivation layer is entirely on outer surfaces of the first semiconductor layer, the second semiconductor layer, and/or the active layer.

5. The light emitting element of claim 1, wherein:
the passivation layer is directly on outer surfaces of the first semiconductor layer, the second semiconductor layer, and/or the active layer.

6. The light emitting element of claim 1, wherein:
the insulation layer comprises an inorganic material.

7. The light emitting element of claim 6, wherein:
the inorganic material comprises at least one selected from SiOx, SiNx, SiOxNy, AlOx, AlNx, ZrOx, HfOx, and TiOx.

8. The light emitting element of claim 1, wherein:
the insulation layer comprises the same material as the first semiconductor layer, the second semiconductor layer, and/or the active layer.

9. The light emitting element of claim 1, wherein:
the insulation layer is directly on the passivation layer.

10. A display device comprising:
a plurality of pixels, each of the plurality of pixels comprising:
a first electrode and a second electrode spaced apart from each other, and
light emitting elements between the first electrode and the second electrode,
wherein each of the light emitting elements comprises a semiconductor core,
a passivation layer surrounding an outer surface of the semiconductor core, and
an insulation layer surrounding an outer surface of the passivation layer,
wherein the passivation layer comprises a two-dimensional (2D) material, and
wherein the 2D material comprises at least one selected from $CaF_2$, $Ti_{0.9}O_2$, Mica, $WS_2$, $MoS_2$, $Ni(OH)_2$, $Cu(OH)_2$, $Mg(OH)_2$, GaS, and Talc, and
wherein the passivation layer comprises a plurality of passivation layers spaced apart from each other in a length direction of the light emitting element on the outer surface of the at least one selected from the first semiconductor layer, the second semiconductor layer, and the active layer.

11. The display device of claim 10, wherein:
the passivation layer is partially on the outer surface of the semiconductor core, and
the semiconductor core exposed by the passivation layer is in contact with the insulation layer.

12. The display device of claim 10, wherein:
the passivation layer is entirely on the outer surface of the semiconductor core.

13. The display device of claim 10, wherein:
a band gap of the 2D material is 3.5 eV or more.

14. The display device of claim 10, wherein:
the semiconductor core comprises the first semiconductor layer, the second semiconductor layer, and the active layer between the first semiconductor layer and the second semiconductor layer.

15. The display device of claim 14, wherein:
the passivation layer is directly on outer surfaces of the first semiconductor layer, the second semiconductor layer, and/or the active layer.

16. The display device of claim 10, wherein:
the insulation layer comprises an inorganic material.

17. The display device of claim 10, wherein:
the insulation layer comprises the same material as the semiconductor core.

18. The display device of claim 10, wherein:
the insulation layer is directly on the passivation layer.

* * * * *